United States Patent
Kim (10) Patent No.: US 7,408,224 B2
(45) Date of Patent: Aug. 5, 2008

(54) VERTICAL TRANSISTOR STRUCTURE FOR USE IN SEMICONDUCTOR DEVICE AND METHOD OF FORMING THE SAME

(75) Inventor: Ji-Young Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/067,282

(22) Filed: Feb. 25, 2005

(65) Prior Publication Data

US 2005/0186740 A1    Aug. 25, 2005

(30) Foreign Application Priority Data

Feb. 25, 2004    (KR) ............... 10-2004-0012486

(51) Int. Cl.
   *H01L 29/739*    (2006.01)
(52) U.S. Cl. .............. 257/331; 257/330; 257/332; 257/520; 257/E29.201
(58) Field of Classification Search .......... 257/331, 257/330–332, 520, E29.201
See application file for complete search history.

(56) References Cited

U.S. PATENT DOCUMENTS

| | | | | |
|---|---|---|---|---|
| 4,811,067 A | * | 3/1989 | Fitzgerald et al. | 257/301 |
| 4,890,144 A | * | 12/1989 | Teng et al. | 257/66 |
| 4,929,988 A | * | 5/1990 | Yoshikawa | 257/316 |
| 5,032,882 A | * | 7/1991 | Okumura et al. | 257/302 |
| 5,122,848 A | * | 6/1992 | Lee et al. | 257/265 |
| 5,900,659 A | | 5/1999 | Lee | |
| 5,981,995 A | * | 11/1999 | Selcuk | 257/330 |
| 5,998,261 A | * | 12/1999 | Hofmann et al. | 438/257 |
| 6,191,446 B1 | * | 2/2001 | Gardner et al. | 257/330 |
| 6,432,775 B2 | * | 8/2002 | Blanchard | 438/270 |
| 6,461,900 B1 | * | 10/2002 | Sundaresan et al. | 438/156 |
| 6,525,403 B2 | | 2/2003 | Inaba et al. | |
| 6,555,872 B1 | | 4/2003 | Dennen | |
| 6,717,200 B1 | * | 4/2004 | Schamberger et al. | 257/302 |
| 6,753,573 B2 | * | 6/2004 | Nakabayashi | 257/330 |
| 6,781,197 B2 | * | 8/2004 | Fujishima et al. | 257/329 |
| 6,800,904 B2 | * | 10/2004 | Fujishima et al. | 257/343 |
| 6,905,944 B2 | * | 6/2005 | Chudzik et al. | 438/435 |
| 7,102,193 B1 | * | 9/2006 | Wang et al. | 257/316 |
| 7,109,551 B2 | * | 9/2006 | Sugi et al. | 257/330 |
| 2001/0010957 A1 | | 8/2001 | Forbes et al. | |
| 2002/0094628 A1 | | 7/2002 | Goebel et al. | |
| 2003/0122171 A1 | | 7/2003 | Huang | |

* cited by examiner

*Primary Examiner*—Jerome Jackson
*Assistant Examiner*—Jose R Diaz
(74) *Attorney, Agent, or Firm*—Marger Johnson & McCollom, P.C.

(57) ABSTRACT

According to some embodiments, a structure of vertical transistor includes gate electrodes distanced by a predetermined interval in an active region, formed in a vertical shape to have a predetermined depth from a top surface of a semiconductor substrate. A gate insulation layer is formed between one side wall of the gate electrode and the substrate. A gate spacer is formed in another sidewall of the gate electrode, covering the gate electrode. A contact plug is formed between the gate spacer. A plug impurity layer is formed in a lower part of the contact plug, and source and drain are formed opposite to the gate electrode within the active region. Thereby, an area occupied by a gate electrode is substantially reduced, so a unit memory cell has a $4F^2$ structure, reducing a memory cell size, by forming a vertical-type gate electrode within an active region.

20 Claims, 7 Drawing Sheets

VERTICAL TRANSISTOR STRUCTURE FOR USE IN SEMICONDUCTOR DEVICE AND METHOD OF FORMING THE SAME

CROSS REFERENCE TO RELATED APPLICATIONS

This application claims priority from Korean Patent Application No. 2004-12486, filed on Feb. 25, 2004, the contents of which are hereby incorporated by reference for all purposes.

BACKGROUND OF THE INVENTION

1. Field of the Invention

This disclosure relates to semiconductor devices, and more particularly, to a vertical transistor structure having a vertical-type gate and to a method of forming the same.

2. Description of the Related Art

Requirements for semiconductor devices with lower electricity consumption and higher capacitance have prompted researchers to develop higher integrated and higher speed semiconductor devices. In particular, a semiconductor memory cell, a DRAM (Dynamic Random Access Memory), has been used widely, and research is focused on ways to enhance the speed and integration of this device.

In general, a DRAM is constructed of one MOS (Metal Oxide Semiconductor) transistor and one storage capacitor. The MOS transistor is incorporated to move charges from a storage capacitor while writing and reading data, the data being represented by the charges. The DRAM also performs a refresh operation by periodically providing charge to the storage capacitor to prevent data loss caused by leakage current, etc.

To obtain a high integration of DRAM, a capacitor capable of sufficiently guaranteeing a storage capacitance even if a storage capacitance size is reduced, is required, and it needs to substantially reduce an occupied area of a unit memory cell. A manufacturing of a general DRAM device is limited by a minimum lithography feature size (F) by a photolithography process. According to the conventional art, the size of a DRAM cell is equal to the square of the given lithography feature size (F) multiplied by a coefficient of eight ($8F^2$). A DRAM device, in which a unit memory cell as a planar type transistor has an ($8F^2$) structure, is disclosed in U.S. Pat. No. 5,900,659 with the title of "Buried bit line DRAM cells". A DRAM device, in which a unit memory cell as a recess type transistor has an ($8F^2$) structure, is disclosed in U.S. Pat. No. 6,555,872 with the title of "TRENCH GATE FERMI-THRESHOLD FIELD EFFECT TRANSISTORS". A DRAM device, in which a unit memory cell as a fin type transistor has an ($8F^2$) structure, is disclosed in U.S. Pat. No. 6,525,403 with the title of "SEMICONDUCTOR DEVICE HAVING MIS FIELD EFFECT TRANSISTORS OR THREE-DIMENSIONAL STRUCTURE".

Figure 1:
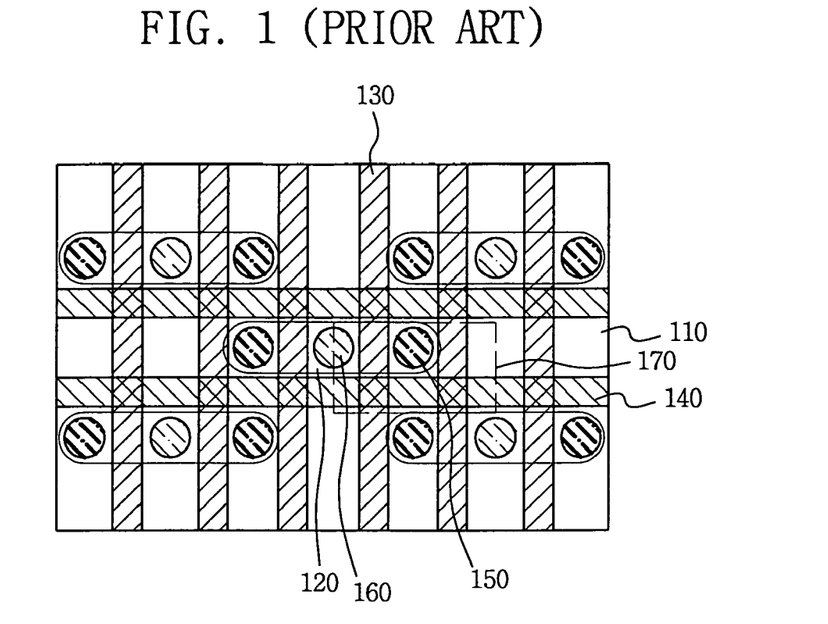
FIG. 1 is a plan view of a layout structure of a MOS transistor according to a related art.

FIG. 1 is a plan view of a layout structure of a MOS transistor according to a prior art.

With reference to FIG. 1, two gate electrodes 130 having a predetermined thickness are formed in a vertical direction on an active region 120 surrounded by a non-active region 110. A contact 150 connected to a bit line is formed on the active region between the gate electrodes 130. A contact 160 connected to a storage node is formed in both side faces of the gate electrodes, and a bit line 140 is disposed in a horizontal direction between the active regions.

According to a related art, since two gate electrodes are formed with a predetemined thickness on one active region and contacts arc formed between the gate electrodes, a gate electrode and a contact occupy a specific horizontal area. Thus, a unit memory cell 170 has an ($8F^2$) structure and this is applied equally to a planar type transistor, a recess type transistor and a fin type transistor. Hence, obtaining a highly-integrated semiconductor device has difficulties and limitations, in particular to integrate beyond a given level.

SUMMARY OF THE INVENTION

Some embodiments of the invention provide a vertical transistor structure and a method for forming the same, in which a unit memory cell has a ($4F^2$) structure. A gate electrode is formed in a vertical type, and a first contact connected to an upper bit line is formed between gate electrodes. In both sides of the gate electrode a second contact connected to a storage node is formed. Hence, unit memory cells constituting a semiconductor device have a ($4F^2$) structure, reducing a cell size and providing high-integrated semiconductor devices.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

Exemplary embodiments of the invention are more fully described in detail with reference to FIGS. 2 to 14. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 2:
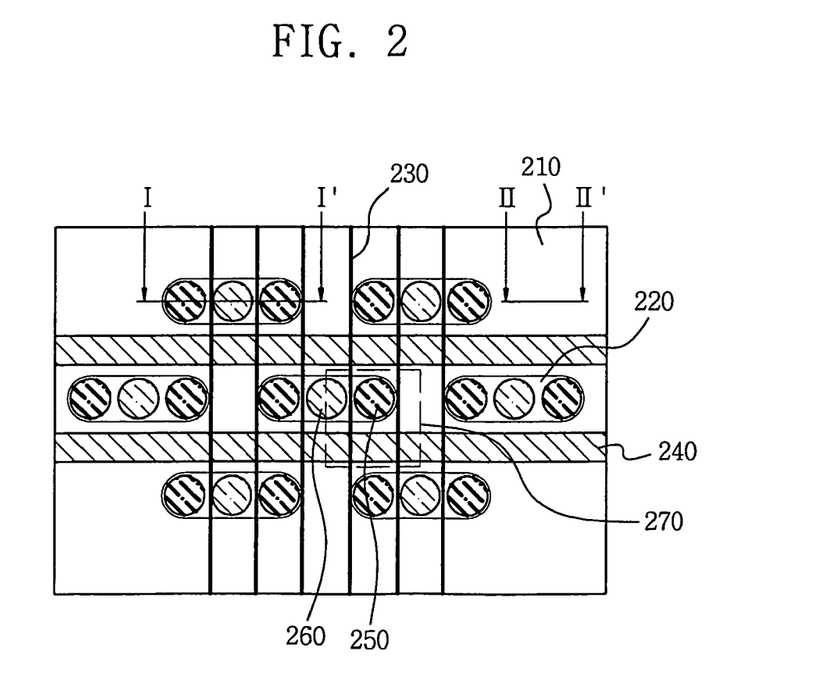
FIG. 2 is a plan view of a layout structure of a vertical transistor according to an exemplary embodiment of the invention.

FIG. 2 is a plan view illustrating a layout structure of a vertical transistor according to an exemplary embodiment of the invention.

Referring first to FIG. 2, two gate electrodes 230 distanced by a predetermined interval are disposed in parallel in a lengthwise direction of an active region within the active region surrounded by a non-active region 210. A first contact 260 connected to a bit line is formed in an active region between the gate electrodes 230, and a second contact 250 connected to a storage node is formed in an active region of both sides of the gate electrodes 230. Bit lines 240 are disposed in parallel in a perpendicular direction to the gate electrodes 230 between the active regions.

The respective active regions are arranged diagonally, maintaining an equal distance between adjacent active regions. A recess is formed in a predetermined position of the active region and then the gate electrodes 230 are formed in a vertical type in a sidewall of the recess, thus an area occupied by the gate electrodes 230 is substantially reduced. A first contact is formed between the gate electrodes 230 and is connected to a bit line. A second contact is formed on both sides of the first contact and is connected to an upper storage node. Hence, a unit memory cell 270 constructed of one transistor and one capacitor has a ($4F^2$) structure.

Figure 9:
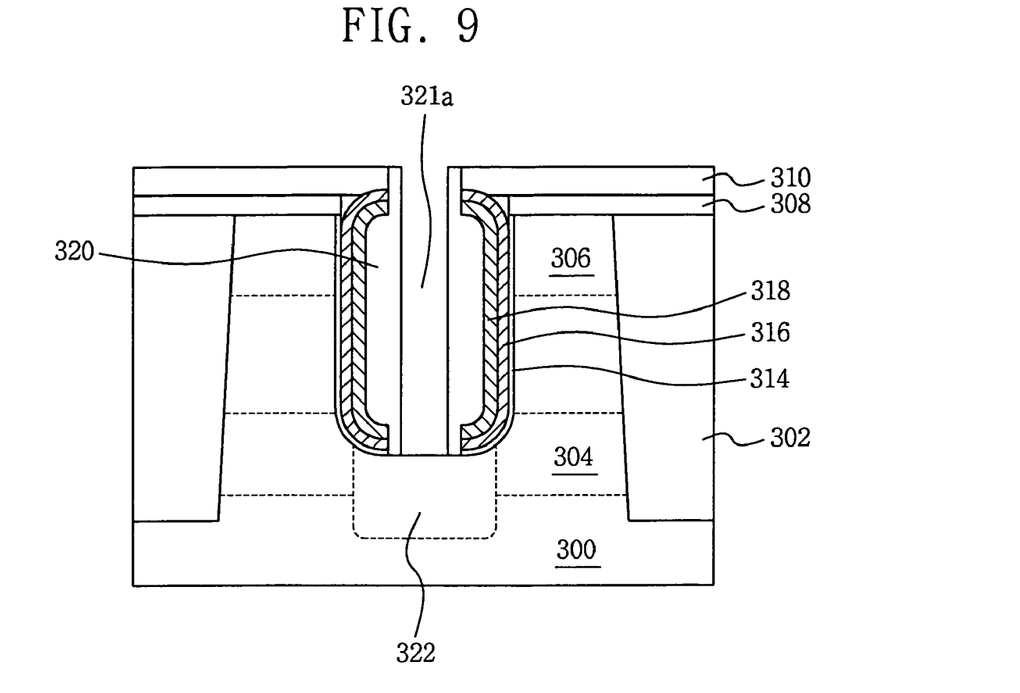
Figure 10:
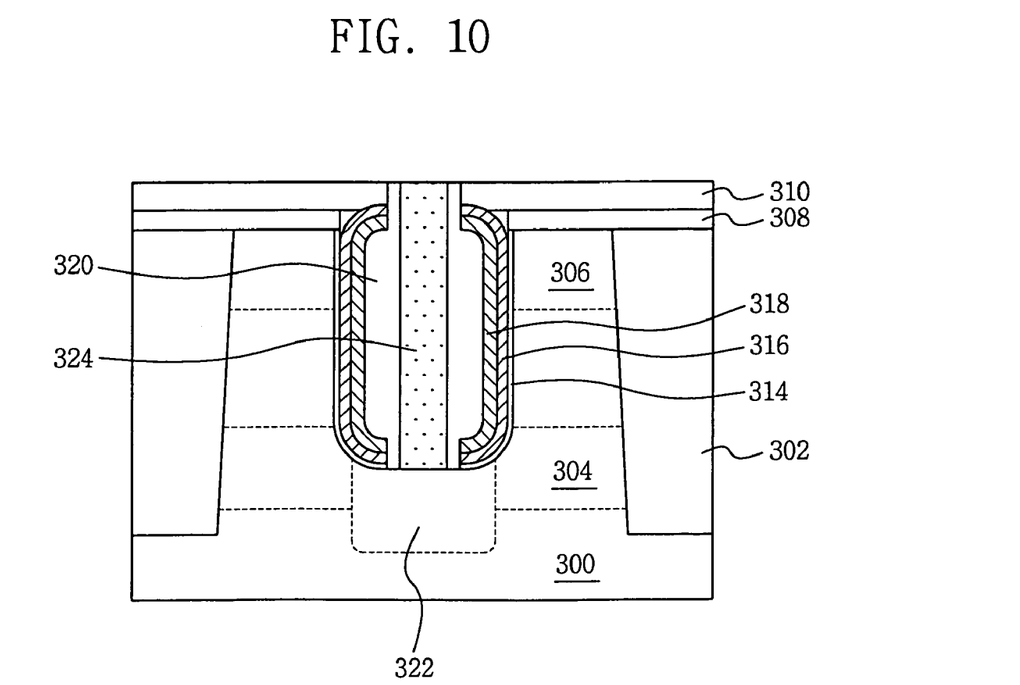
Figure 11:
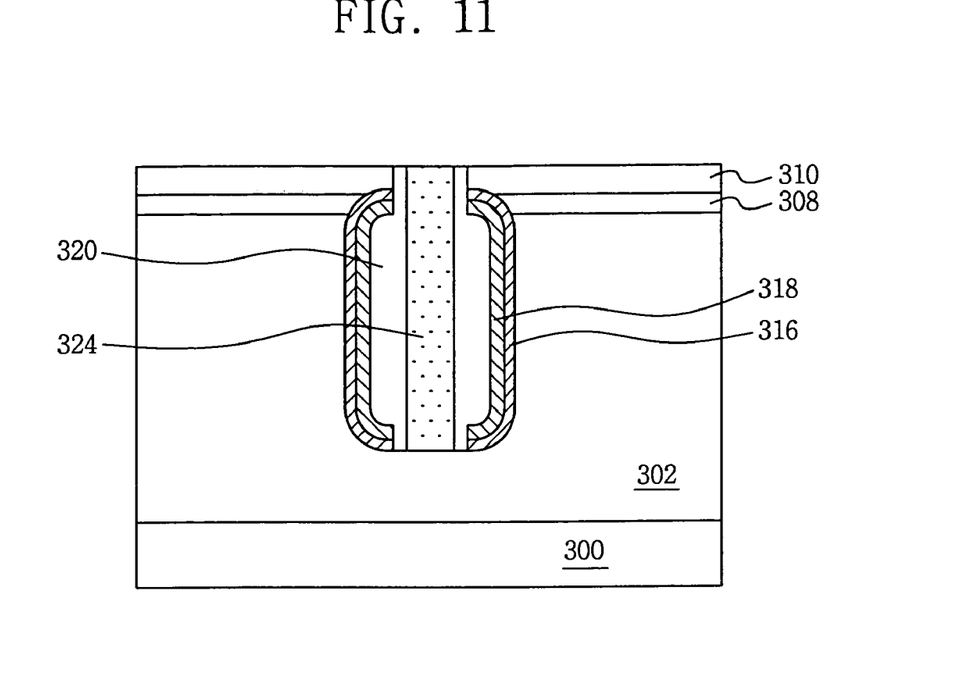
FIGS. 11 and 13 are sectional views illustrating sequential processes of forming a vertical transistor according to an exemplary embodiment of the invention, taken along a line II-II' of FIG. 2.
Figure 12:
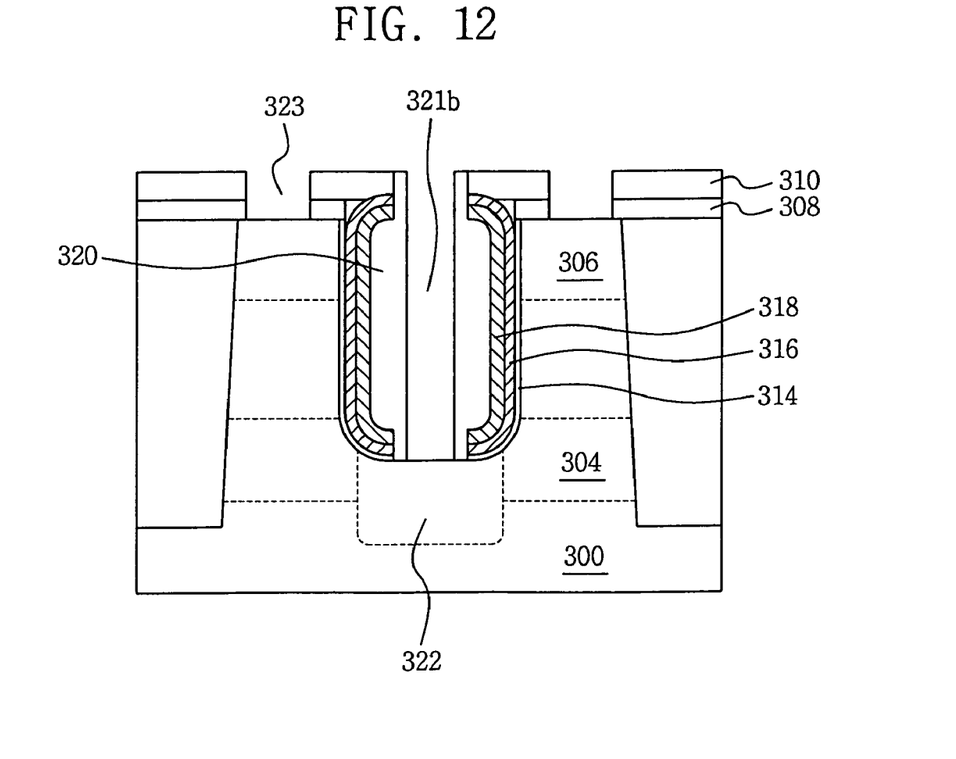
Figure 13:
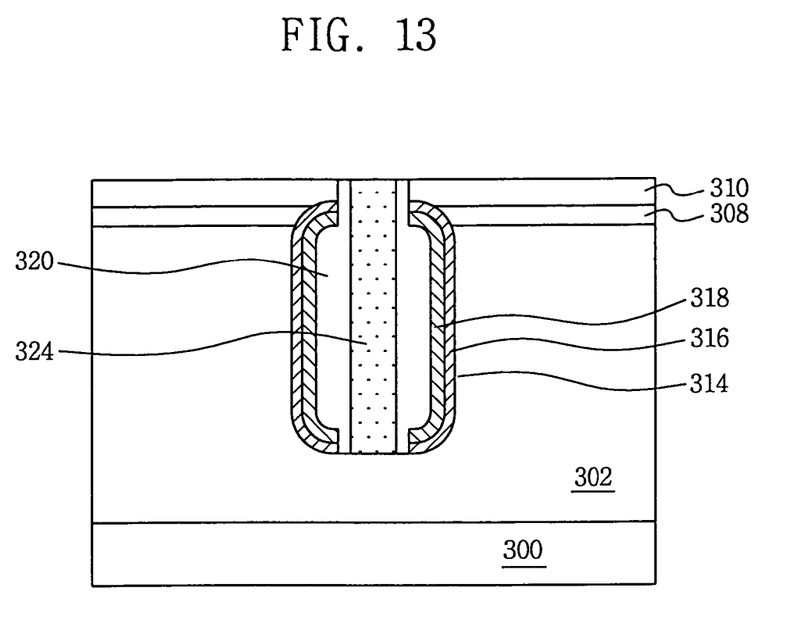

FIGS. 3 to 14 are sectional views illustrating sequential processes of forming a vertical transistor according to an exemplary embodiment of the invention, in which FIGS. 3 to 10, and FIGS. 12 and 14, are sectional views taken along a line I-I' of FIG. 2 and in which FIGS. 11 and 13 are sectional views taken along a line II-II' of FIG. 2.

Figure 3:
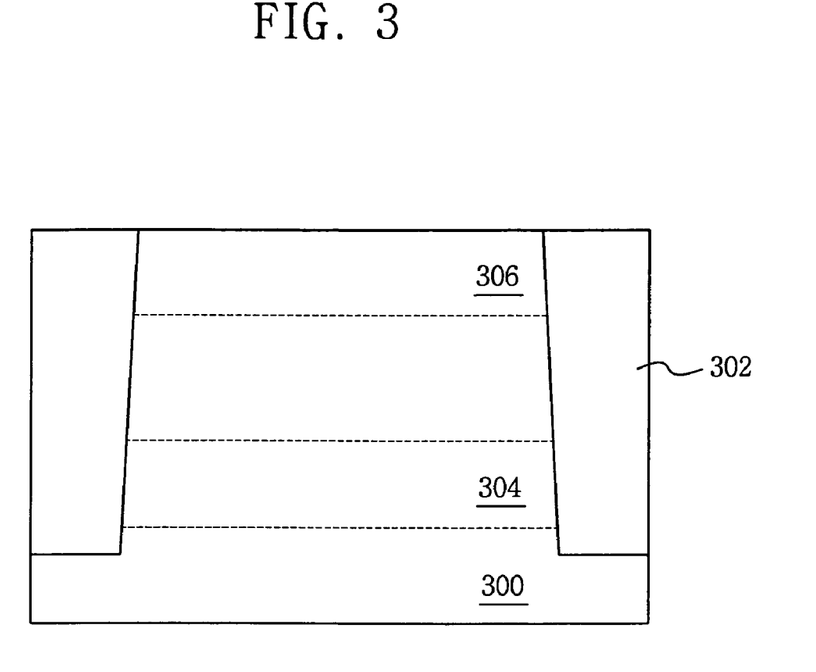
FIGS. 3 to 10 and FIGS. 12 and 14, are sectional views illustrating sequential processes of forming a vertical transistor according to an exemplary embodiment of the invention, taken along a line I-I' of FIG. 2.

Referring first to FIG. 3, a shallow trench insulator 302 defining an active region and a non-active region is formed on a predetermined area of a p-type semiconductor substrate 300 p-type impurity, e.g., B ion, is ion implanted in a surface of the p-type semiconductor substrate 300. A thermal process is then executed, thus forming a p-type well region (not shown). The shallow trench insulator 302 is formed by a device isolation method such as an STI (Shallow Trench Isolation), etc., and is formed of any one among an oxide layer group that is composed of SOG (Spin On Glass), USG (Undoped Silicate Glass), BPSG (Boron Phosphorus Silicate Glass), PSG (Phosphor Silicate Glass), PE-TEOS (Plasma Enhanced Tetra Ethyl Otho Silicate), and flowable oxide material; or may be formed of a multilayer including two or more therefrom. The shallow trench insulator 302 may be formed with a depth of 2500 Å to 3000 Å, and may be formed after forming a p-type well region.

Subsequently, p-type impurity is ion implanted in an active region defined by the shallow trench insulator 302, thus forming a threshold voltage control region 304. The threshold voltage control region 304 is provided to control at a predetermined level, a threshold voltage of a vertical transistor by implanted p-type impurity in the active region defined by the shallow trench insulator 302. For example, B or $BF^2$ ion is implanted in the active region at a density of about $1.0 \times 10^{13}$ ions/$cm^2$ with an energy of 40 KeV to 60 KeV, thus forming the threshold voltage control region 304.

Next, n type impurity, e.g., P, As, etc., is ion implanted by a density of $1.0 \times 10^{13}$ ions/$cm^2$ with an energy of 20 KeV to 30 KeV by using the shallow trench insulator 302 as an ion implantation mask, thus forming a source/drain region 306. In this case, the source/drain region 306 is formed shallower than a depth of the threshold voltage control region 304.

Figure 4:
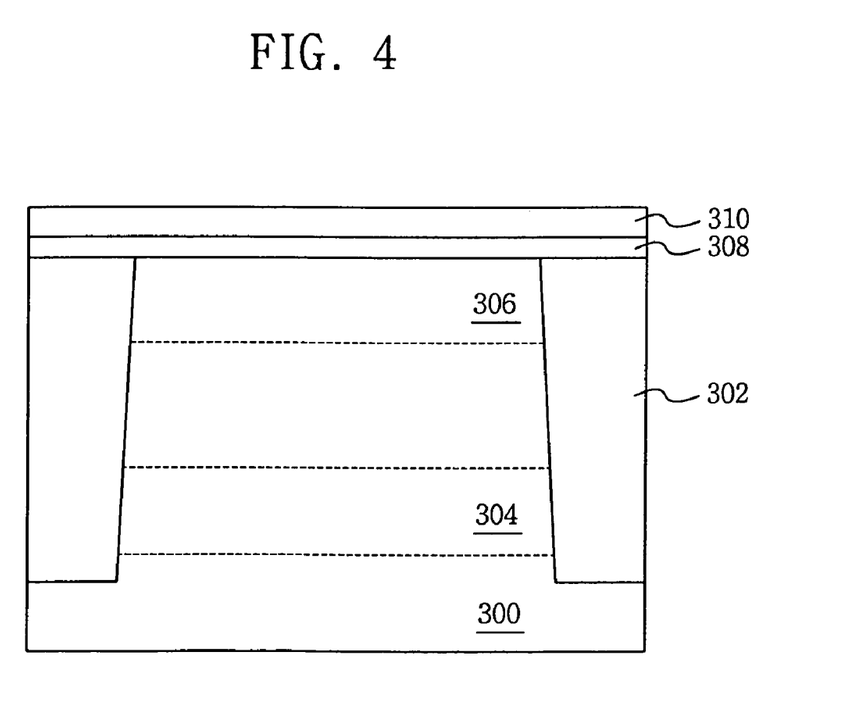

With reference to FIG. 4, first and second insulation layers 308 and 310 may be sequentially formed entirely on the semiconductor substrate including an active region and a non-active region. The first insulation layer 308 is formed of an oxide layer material, and may be formed by a thermal oxide process performed on a surface of the semiconductor substrate with a thickness of about 100 Å to 200 Å. The second insulation layer 310 is formed of a nitride layer material having an etch selection rate for the first insulation layer 308, and may be formed with a thickness of about 500 Å to serve as an etch mask in a subsequent recess formation process. The second insulation layer may be formed by a general deposition method such as a chemical vapor deposition (CVD), a low-pressure chemical vapor deposition (LPCVD), or a plasma chemical vapor deposition (PECVD), etc.

Figure 5:
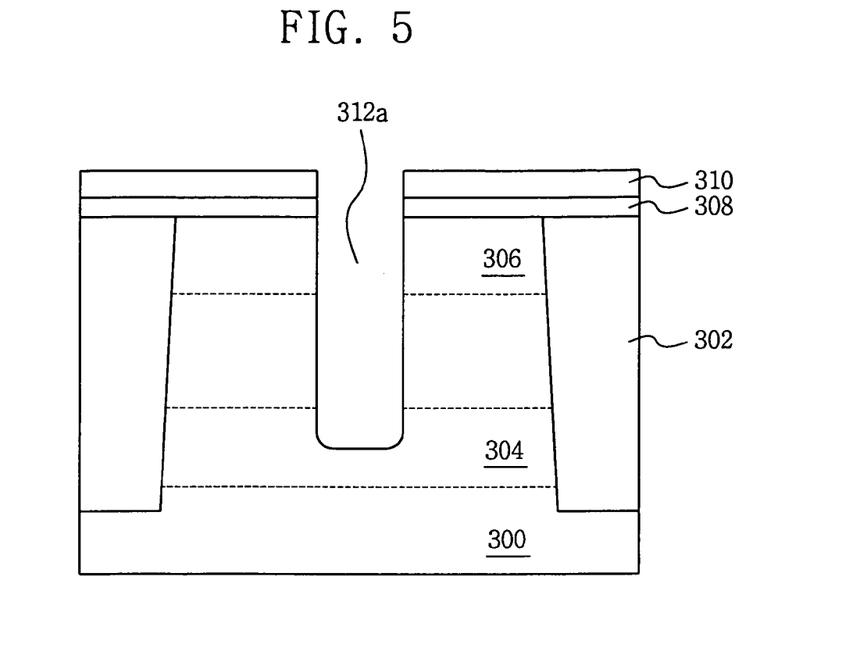

Referring to FIG. 5, a photoresist pattern (not shown) for exposing a recess formation portion within the active region is formed on the second insulation layer 310. Then the second insulation layer 310, the first insulation layer 308 and the substrate 300 are sequentially etched through the photoresist pattern, thus forming a recess 312a. The recess 312a is formed not only on the active region but also on a non-active region, being extended from an active region. The recess 312a may be formed, for example, with a diameter of about 100 nm and a depth of about 1500 Å to 2500 Å, or the length or the depth of the recess may be determined in conformity with various design rules. Next, the photoresist pattern is removed by an ashing or strip process.

Figure 6:
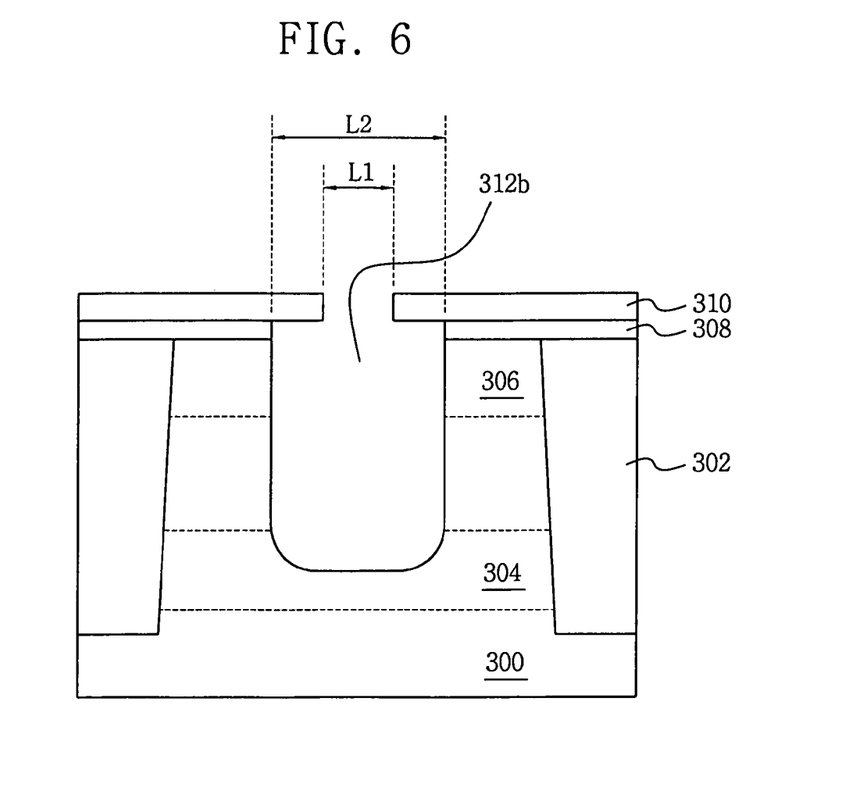

With reference to FIG. 6, to widen a recess sidewall while maintaining an upper opening length, a wet etching process is executed within the recess. Thus, only a substrate of a recess sidewall and a portion of the first insulation layer are undercut, and the second insulation layer with the upper opening length remains in an upper side of the recess. Hence, a second length L2, which may be a diameter, of the recess 312b is longer by the undercut length than a first length L1 opened in the second insulation layer, where the second insulation layer remains in an upper part of the recess 312b.

Figure 7:
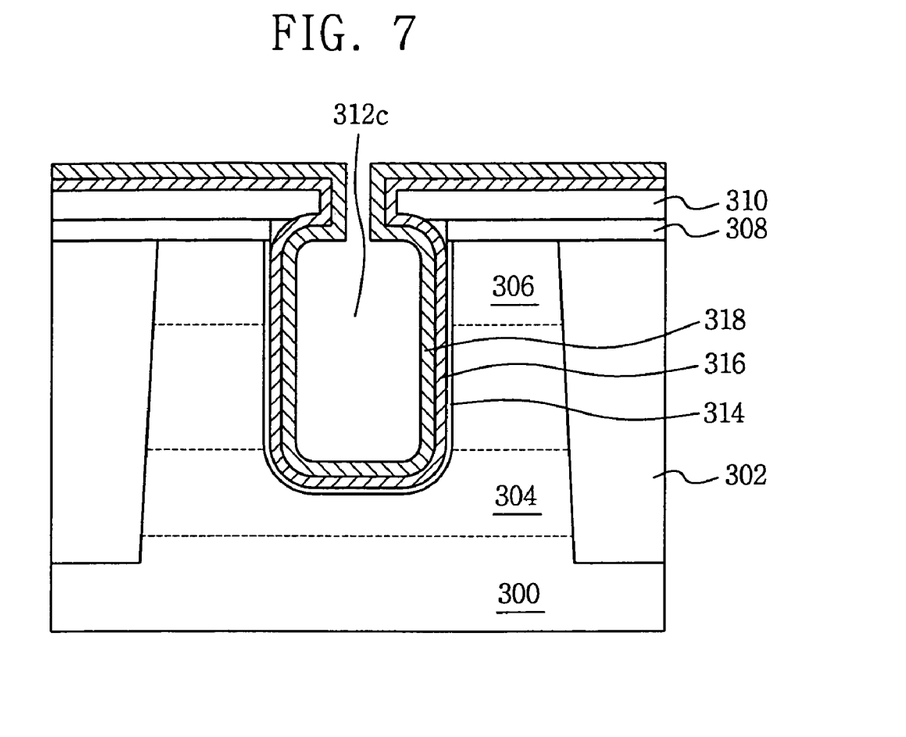

As shown in FIG. 7, a gate insulation layer 314, a first gate conductive layer 316 and a second gate conductive layer 318 are formed sequentially. The gate insulation layer 314 is formed of an oxide layer material with a thickness of about 40 Å to 60 Å. The gate insulation layer 314 may be formed by performing a thermal oxidation on a side face and bottom face of the recess 312b in dry oxygen at 950° C. for 20 minutes, or by a deposition method such as CVD or sputtering, etc. The first gate conductive layer 316 may employ a general deposition such as CVD, LPCVD, or PECVD, and may be formed of a polysilicon material. The second gate conductive layer 318 may be formed by a general deposition, and may be formed of a metal, such as Ti, Ta, W, Ni, Cr, Ir or Ru, or of a silicide layer. The first and second gate conductive layers 316 and 318 are formed as a gate electrode, and may be formed of a single layer made of polysilicon material.

Figure 8:
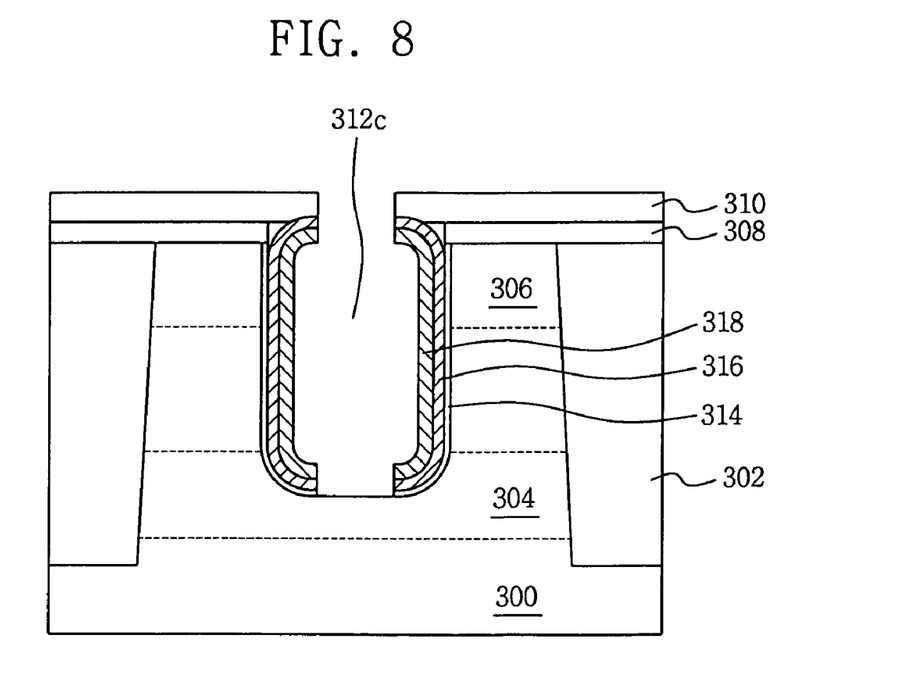

Referring to FIG. 8, to remove first and second gate conductive layers formed in an upper part and side face of the second insulation layer 310, and in a bottom face of the recess 312c, a dry etching such as a plasma dry etching process is executed. Thus, first and second gate electrodes 316 and 318 are formed in a vertical type, only in both sidewalls of the recess, in a lower part of the second insulation layer and in a bottom face portion of the recess. Then, a gate insulation layer remaining in a bottom face of a recess 312c is etched to expose a portion of substrate.

With reference to FIG. 9, a gate spacer 320 is formed entirely on a semiconductor substrate including the recess interior, and then an etching process is executed to form a spacer having a predetermined thickness on the second conductive layer 318. That is, the gate spacer 320 is formed only on the second gate electrode 318, to sufficiently cover first and second gate conductive layers 316 and 318 formed in a sidewall of the recess, and to ensure a space to form a first contact hole 321a connected to a bit line provided in a center of the recess. The gate spacer 320 may be formed of a nitride layer material by a deposition method such as CVD or reflow method, or by using high-density plasma (HDP) equipment.

Next, a plug impurity layer 322 is formed in a lower part of the contact hole 321a to improve a contact resistance and easily form a channel. The plug impurity layer 322 may be formed by implanting an n-type impurity in an exposed substrate at a density of about $1.0 \times 10^{13}$ to $3.0 \times 10^{13}$ ions/$cm^2$ with an energy of about 20 KeV, by using the gate spacer 320 as an ion implantation mask, where the n-type impurity is, for example, P or As, etc. Then, an annealing process may be executed to electrically activate the plug impurity layer 322.

As shown in FIG. 10, a third insulation layer 324 is sufficiently filled into the recess, and next a planarization process such as CMP is performed by using the second insulation layer 310 as a planarization stop layer, thereby planarizing the third insulation layer 324. The third insulation layer 324 may be formed of an oxide layer such as USG (Undoped Silicate Glass), BPSG (Boron Phosphorus Silicate Glass), PSG (Phosphor Silicate Glass), or a PE-TEOS (Plasma Enhanced Tetra Ethyl Otho Silicate) layer, etc. The third insulation layer 324 may be formed by a general deposition method such as CVD, LPCVD, or PECVD, etc.

As shown in FIG. 11, first and second gate conductive layers 316 and 318 are formed in both sidewalls of a recess by a vertical shape in a non-active region to which a gate electrode of an active region is extended, like a case of FIG. 10. A gate spacer 320 is formed to sufficiently cover the first and second gate conductive layer, and a third insulation layer 324 is formed between the gate spacer.

In FIG. 12, thereon, a photoresist pattern (not shown) for exposing first and second contact formation portions is formed on the second insulation layer 310. Subsequently, the second insulation layer 310 is etched by using the photoresist pattern as an etch mask, then the first and third insulation layers 308 and 324 are etched, thus forming first and second contact holes 321b and 323. The photoresist pattern is removed by an ashing or strip process.

In FIG. 13, a contact is unnecessary within a non-active region, thus the third insulation 324 formed in the gate spacer remains intact.

Figure 14:
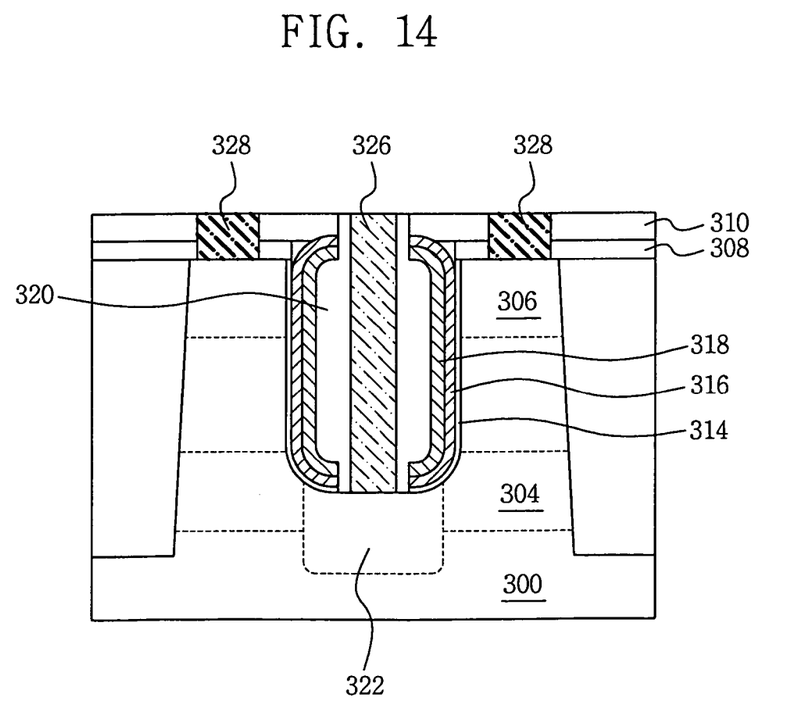

In FIG. 14, conductive material, e.g., a polysilicon material or other conductive material, is sufficiently filled into the first and second contact holes 321b and 323, and subsequently, a planarization process such as CMP or etch-back, etc. is executed until the second insulation layer is exposed, thus forming a first contact plug 326 electrically connected to a bit line and a second contact plug 328 electrically connected to a storage node. Before filling the conductive material, a barrier layer may be further formed within the first and second contact holes. For example, a dual layer formed of Ti layer/TiN layer may be formed.

As shown in FIG. 14, a vertical transistor structure according to an exemplary embodiment includes gate electrodes, which are distanced by a determined interval in an active region and are formed in a vertical shape to have a determined depth from a top surface of a semiconductor substrate; a gate insulation layer formed between one side wall of the gate electrode and a substrate; a gate spacer formed in another side wall of the gate electrode, covering the gate electrode; a contact plug that is formed in the gate spacer and that electrically connects an upper conductive line with the substrate; a plug impurity layer formed in a lower part of the contact plug; and source/drain formed opposite to the gate electrode within the active region.

In a vertical transistor structure according to an exemplary embodiment of the invention, a gate electrode is formed by a vertical shape within an active region, and a first contact is formed being connected to an upper bit line between gate electrodes, In both sides of the gate electrode, a second contact is formed being connected to a storage node, thus substantially reducing an area occupied by the gate electrode and forming a unit memory cell having a ($4F^2$) structure. In other words, in forming a unit memory cell according to an exemplary embodiment, only an area where a first contact connected to a bit line and a second contact connected to a storage node will be formed, is needed, thus an area of unit memory cell can be substantially reduced, as compared with an ($8F^2$) structure of a related art in which a gate electrode and a contact occupy a specific horizontal space. In comparison with the ($8F^2$) structure of a unit memory cell according to a related art; according to an exemplary embodiment of the invention providing a ($4F^2$) structure of unit memory cell, the number of memory cells disposed in the same area of a semiconductor chip can increase, thereby remarkably solving a limitation problem of a high-integration of semiconductor devices.

As described above, according to an exemplary embodiment of the invention, a gate electrode is formed in a vertical shape, and a first contact connected to a bit line is formed between gate electrodes. Also a second contact connected to a storage node is formed in both sides of the gate electrode. Thereby, unit memory cells constituting a semiconductor device have a ($4F^2$) structure.

Additionally, unit cells constituting a semiconductor device are formed in a ($4F^2$) structure, thus reducing a cell size and enhancing a high integration of semiconductor devices.

Embodiments of the invention may be practiced in many ways. What follows are exemplary, non-limiting descriptions of some of these embodiments.

According to an exemplary embodiment of the invention, a structure of vertical transistor formed on a semiconductor substrate on which an active region and a non-active region are defined by a shallow trench insulator, includes gate electrodes, which are distanced by a determined interval in the active region and are formed in a vertical shape to have a determined depth from a top surface of the semiconductor substrate; a gate insulation layer formed between one side wall of the gate electrode and a substrate; a gate spacer formed in another side wall of the gate electrode, covering the gate electrode; a contact plug that is formed in the gate spacer and that electrically connects an upper conductive line with the substrate; a plug impurity layer formed under the contact plug; and source/drain formed opposite to the gate electrode within the active region.

According to another exemplary embodiment of the invention, a method of forming a vertical transistor on a semiconductor substrate on which a shallow trench insulator defining an active region and a non-active region was formed, includes forming source/drain regions on the active region; forming a recess of which an upper portion is covered with a first insulation layer in the active region and non-active region; forming a gate insulation layer within the recess; forming a gate electrode on the gate insulation layer, and then removing a gate electrode and a gate insulation layer formed in a bottom of the recess to partially expose the substrate; forming a gate spacer of a predetermined thickness on the gate electrode, to cover the gate electrode and form a contact hole in a center part of the recess; ion implanting impurity in a substrate by using the gate spacer as an ion implantation mask, thus forming a plug impurity layer; and filling the contact hole of the active region with conductive material, thus forming a contact plug electrically connected to an upper conductive line.

The forming of the recess includes sequentially forming first and second insulation layers on a semiconductor substrate on which the shallow trench insulator was formed, forming a recess within the active region by a photolithography and etching process, and wet etching a substrate of a recess sidewall and a portion of the first insulation layer, thus forming a recess of which an upper portion is covered by the second insulation layer.

The forming of the gate spacer includes forming a gate spacer on the gate electrode and exposed substrate, and executing a dry etching so that only a spacer of a predetermined thickness remains on the gate electrode and a contact hole is formed in a center part of the recess.

The vertical transistor forming method further includes, after forming the plug impurity layer, filling a contact hole formed in the active region and non-active region with a third insulation layer, planarizing the third insulation layer, removing the third insulation layer formed within the active region by a photolithography and etching process, thereby forming a contact hole connected to an upper conductive line, and removing an insulation layer from the non-active region, thereby forming a contact hole connected to a storage node.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

I claim:

1. A vertical transistor structure formed on a semiconductor substrate on which an active region and a non-active region are defined by a shallow trench insulator, the structure comprising:
    gate electrodes, which are distanced by a predetermined interval in the active region and are formed in a vertical shape to have a predetermined depth from a top surface of the semiconductor substrate;
    a gate insulation layer formed between a first side wall of the gate electrodes and the semiconductor substrate;
    a gate spacer formed on a second side wall of the gate electrodes, covering the gate electrodes;
    a contact plug, which is formed in the gate spacer and which electrically connects an upper conductive line with the semiconductor substrate;
    a plug impurity layer formed in a lower part of the contact plug;
    a source/drain formed opposite to the gate electrode within the active region;
    a threshold voltage control region for controlling a threshold voltage within the active region, the threshold voltage control region disposed below the source/drain; and
    a silicon nitride layer, the silicon nitride layer disposed in contact with a top surface of the gate electrodes, the silicon nitride layer disposed directly over an entirety of the top surface of the gate electrodes.

2. The structure of claim 1, further comprising another contact plug, the another contact plug physically touching the source/drain and electrically connected to a storage node.

3. The structure of claim 1, wherein the gate electrodes are formed of a single layer of polysilicon or of a multilayer having a polycide structure.

4. The structure of claim 1, wherein the gate electrodes are distanced with an interval of about 100 nm to 200 nm, with a depth of about 1500 Å to 2500 Å.

5. The structure of claim 1, wherein the gate insulation layer is formed of an oxide layer material and isolates the semiconductor substrate from the gate electrodes.

6. The structure of claim 1, wherein the gate spacer is formed of nitride layer material and separates the gate electrodes from the contact plug.

7. The structure of claim 1, wherein the contact plug is electrically connected to an upper bit line.

8. The structure of claim 1, the plug impurity layer containing n type impurity ions at a density of about $1.0 \times 10^{13}$ to $3.0 \times 10^{13}$ ions/cm$^2$.

9. The structure of claim 1, wherein the source/drain comprises a source region and a drain region that are at equal levels.

10. The structure of claim 1, wherein the source/drain comprises a source region and a drain region and wherein the threshold voltage control region is below both the source region and the drain region.

11. A structure comprising:
    a shallow trench insulator disposed in a semiconductor substrate to define an active region and a non-active region of the semiconductor substrate;
    gate electrodes disposed in the active region, the gate electrodes having a substantially vertical shape, a lower portion of each of the gate electrodes disposed below a top surface of the semiconductor substrate, the lower portion of each of the gate electrodes representing a majority of the gate electrode;
    a gate insulation layer, the gate insulation layer in physical contact with the lower portion of the gate electrodes and in physical contact with the semiconductor substrate from the top surface of the semiconductor substrate to a bottom surface of the gate electrodes;
    a gate spacer, the gate spacer in physical contact with a remainder of the lower portion of the gate electrodes that is not in physical contact with the gate insulation layer;
    a first contact plug, the first contact plug surrounded by the gate spacer and in physical contact with the gate spacer, the first contact plug electrically connecting an upper conductive line with the semiconductor substrate;
    a plug impurity layer, the plug impurity layer disposed in a portion of the semiconductor substrate directly beneath the first contact plug;
    source/drain regions, the source/drain regions disposed opposite the gate electrodes in the active region of the semiconductor substrate; and
    a first insulation layer disposed on and physically touching the top surface of the semiconductor substrate and a top surface of the shallow trench insulator, the first insulation layer having a first gap, a width of the first gap defining a maximum width of a space occupied by the gate electrodes.

12. The structure of claim 11, further comprising a second contact plug, the second contact plug physically touching one of the source/drain regions.

13. The structure of claim 11, the gate electrodes consisting of a single layer of polysilicon.

14. The structure of claim 11, the gate electrodes having a multiple layer polycide structure.

15. The structure of claim 11, the gate electrodes disposed at a maximum depth from the top surface of the semiconductor substrate, the maximum depth about 1500 Å to 2500 Å.

16. The structure of claim 11, the first insulation layer comprising an oxide layer.

17. The structure of claim 11, further comprising a second insulation layer disposed on and physically touching a top surface of the first insulation layer and a top surface of the gate electrodes, the second insulation layer having a second gap, a width of the second gap less than a width of the first gap, the width of the second gap defining a minimum separation between the gate electrodes.

18. The structure of claim 17, the width of the second gap about 100 nm to 200 nm.

19. The structure of claim 17, the second insulation layer comprising a silicon nitride layer.

20. The structure of claim 11, further comprising a threshold voltage control region, the threshold voltage control region disposed in the active region of the semiconductor substrate, the threshold voltage control region separated from the source/drain regions and located below the source/drain regions.

* * * * *

UNITED STATES PATENT AND TRADEMARK OFFICE
CERTIFICATE OF CORRECTION

PATENT NO. : 7,408,224 B2 Page 1 of 1
APPLICATION NO. : 11/067282
DATED : August 5, 2008
INVENTOR(S) : Ji-Young Kim It is certified that error appears in the above-identified patent and that said Letters Patent is hereby corrected as shown below:

Column 1, line 66, the word "predetemined" should read -- predetermined --;
Column 1, line 67, the word "arc" should read -- are --;
Column 5, line 55, the words "electrodes, In" should read -- electrodes. In --.

Signed and Sealed this

Fourth Day of November, 2008

JON W. DUDAS
*Director of the United States Patent and Trademark Office*